United States Patent
Arnaud

(10) Patent No.: US 9,257,420 B2
(45) Date of Patent: Feb. 9, 2016

(54) OVERVOLTAGE PROTECTION DEVICE

(71) Applicant: STMicroelectronics (Tours) SAS, Tours (FR)

(72) Inventor: Aurelie Arnaud, Saint-Cyr-sur-Loire (FR)

(73) Assignee: STMicroelectronics (Tours) SAS, Tours (FR)

(*) Notice: Subject to any disclaimer, the term of this patent is extended or adjusted under 35 U.S.C. 154(b) by 88 days.

(21) Appl. No.: 14/171,931

(22) Filed: Feb. 4, 2014

(65) Prior Publication Data

US 2015/0221628 A1 Aug. 6, 2015

(51) Int. Cl.
*H01L 29/02* (2006.01)
*H01L 27/02* (2006.01)
*H01L 27/08* (2006.01)

(52) U.S. Cl.
CPC ........ *H01L 27/0248* (2013.01); *H01L 27/0814* (2013.01)

(58) Field of Classification Search
CPC .................................................. H01L 27/0251
USPC ........................................... 257/357, 355, 487
See application file for complete search history.

(56) References Cited

U.S. PATENT DOCUMENTS

| | | | | |
|---|---|---|---|---|
| 4,888,623 A | * | 12/1989 | Enomoto et al. | 257/476 |
| 5,386,136 A | * | 1/1995 | Williams et al. | 257/409 |
| 5,883,413 A | * | 3/1999 | Ludikhuize | 257/343 |
| 2008/0121988 A1 | * | 5/2008 | Mallikararjunaswamy et al. | 257/328 |
| 2009/0057716 A1 | * | 3/2009 | Rodrigues | 257/173 |
| 2010/0155774 A1 | * | 6/2010 | Tseng et al. | 257/173 |

* cited by examiner

*Primary Examiner* — Caridad Everhart
(74) *Attorney, Agent, or Firm* — Gardere Wynne Sewell LLP

(57) ABSTRACT

An overvoltage protection device including: a doped substrate of a first conductivity type having a first doping level, coated with a doped epitaxial layer of the second conductivity type having a second doping level; a first doped buried region of the second conductivity type having a third doping level greater than the second level, located at the interface between the substrate and the epitaxial layer in a first portion of the device; and a second doped buried region of the first conductivity type having a fourth doping level greater than the first level, located at the interface between the substrate and the epitaxial layer in a second portion of the device.

24 Claims, 2 Drawing Sheets

OVERVOLTAGE PROTECTION DEVICE

BACKGROUND

The present disclosure generally relates to electronic circuits, and more specifically aims at overvoltage protection devices.

DISCUSSION OF THE RELATED ART

Overvoltage protection devices comprising, integrated inside and on top of a same semiconductor substrate, several diodes forming a network intended to couple together terminals or nodes of a device to be protected, have already been provided. However, existing protection devices have various disadvantages. In particular, the problem of capacitances inherent to protection diodes which may disturb the operation of the device to be protected or the operation of the actual protection device is posed.

SUMMARY

Thus, an embodiment provides an overvoltage protection device, comprising: a doped substrate of a first conductivity type having a first doping level, coated with a doped epitaxial layer of the second conductivity type having a second doping level; a first doped buried region of the second conductivity type having a third doping level greater than the second level, located at the interface between the substrate and the epitaxial layer in a first portion of the device; and a second doped buried region of the first conductivity type having a fourth doping level greater than the first level, located at the interface between the substrate and the epitaxial layer in a second portion of the device.

According to an embodiment, the junction between the substrate and the first buried region forms a first diode, and the junction between the second buried region and the epitaxial layer forms a second diode.

According to an embodiment, the first and second diodes have their conduction areas of the first conductivity type connected via the substrate.

According to an embodiment, the first diode has its conduction area of the second conductivity type coupled to a first terminal of the device via the epitaxial layer, and the second diode has its conduction area of the second conductivity type coupled to a second terminal of the device via the epitaxial layer.

According to an embodiment, the first diode is a diode having a controlled avalanche voltage.

According to an embodiment, the second diode is a diode having a controlled avalanche voltage.

According to an embodiment, the second diode is a standard diode which is not intended to operate in avalanche.

According to an embodiment, the first and second diodes have their conduction areas of the second conductivity type separated by a vertical insulation region crossing the epitaxial layer.

According to an embodiment, the second doping level is lower than the first doping level.

According to an embodiment, the first doping level is greater than $10^{18}$ atoms/cm$^3$, the second doping level is lower than $10^{17}$ atoms/cm$^3$, the third doping level is greater than $10^{18}$ atoms/cm$^3$, and the fourth doping level is between 2 and 10 times the first doping level.

According to an embodiment, the first doping level is in the range from $10^{19}$ to $10^{21}$ atoms/cm$^3$, the second doping level is in the range from $10^{13}$ to $10^{16}$ atoms/cm$^3$, the third doping level is in the range from $10^{19}$ to $10^{21}$ atoms/cm$^3$, and the fourth doping level is between 2 and 10 times the first doping level.

The foregoing and other features and advantages will be discussed in detail in the following non-limiting description of specific embodiments in connection with the accompanying drawings.

DETAILED DESCRIPTION

Figure 1:
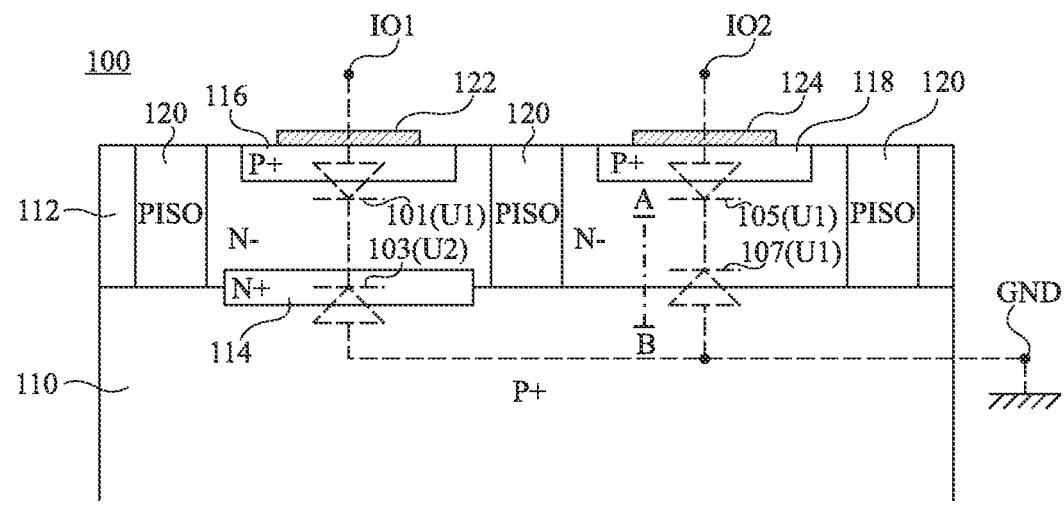
FIG. 1 is a cross-section view schematically showing an example of an overvoltage protection device.

For clarity, the same elements have been designated with the same reference numerals in the various drawings and, further, as usual in the representation of integrated circuits, the various drawings are not to scale. Further, in the following description, unless otherwise indicated, terms "approximately", "substantially", "around", and "in the order of" mean "to within 10%", and directional references, such as "overhanging", "covering", "topping", "above", "under", "upper surface", "lower surface", etc. apply to devices arranged as illustrated in the corresponding cross-section views.

FIG. 1 is a cross-section view schematically showing an example of an overvoltage protection device 100. Device 100 comprises a network of bidirectional protections structures having several different start thresholds. In the shown example, only two bidirectional protection structures have been shown. In practice, similar devices comprising a number of bidirectional protections structures greater than two may be formed.

In the example of FIG. 1, device 100 comprises a first bidirectional protection structure comprising a diode 101 and a diode 103, the anode of diode 101 being connected to a terminal or node IO1 of device 100, the cathode of diode 101 being connected to the cathode of diode 103, and the anode of diode 103 being connected to a terminal or node GND of device 100. In this example, device 100 further comprises a second bidirectional protection structure comprising a diode 105 and a diode 107, the anode of diode 105 being connected to a terminal or node IO2 of device 100, the cathode of diode 105 being connected to the cathode of diode 107, and the anode of diode 107 being connected to node GND. In this example, the second bidirectional protection structure is adjacent to the first bidirectional protection structure. Diodes 101, 103, 105, and 107 are for example diodes having a controlled avalanche voltage. In the shown example, diodes 101, 105, and 107 substantially have the same avalanche voltage U1, for example in the range from 20 to 80 V, and diode 103 has an avalanche voltage U2 different from voltage U1, for example, smaller than voltage U1, for example, in the range from 2.5 to 10 V. Terminals or nodes IO1, IO2, and GND of device 100 are intended to be connected to terminals or nodes of a device to be protected.

In the case of a positive overvoltage between nodes IO1 and GND, diode 101 is forward biased and diode 103 is reverse biased. When the overvoltage level between nodes IO1 and GND exceeds value U2 (plus the forward voltage drop of diode 101), diode 103 avalanches and the overvoltage is removed via diodes 101 and 103.

In the case of a negative overvoltage between nodes IO1 and GND, diode 103 is forward biased and diode 101 is reverse biased. When the overvoltage level between nodes GND and IO1 exceeds value U1 (plus the forward voltage drop of diode 103), diode 101 avalanches and the overvoltage is removed via diodes 103 and 101.

In the case of a positive overvoltage between nodes IO2 and GND, diode 105 is forward biased and diode 107 is reverse biased. When the overvoltage level between nodes IO2 and GND exceeds value U1 (plus the forward voltage drop of diode 105), diode 107 avalanches and the overvoltage is removed via diodes 105 and 107.

In the case of a negative overvoltage between nodes IO2 and GND, diode 107 is forward biased and diode 105 is reverse biased. When the overvoltage level between nodes GND and IO2 exceeds value U1 (plus the forward voltage drop of diode 107), diode 105 avalanches and the overvoltage is removed via diodes 107 and 105.

Thus, the start threshold of the protection between nodes IO1 and GND is approximately equal, in forward mode, to voltage U2, and in reverse mode, to voltage U1, and the start threshold of the protection between nodes IO2 and GND is approximately equal, in forward mode as in reverse mode, to voltage U1.

Device 100 of FIG. 1 comprises a P-type doped semiconductor substrate 110 (P+), coated with an N-type doped epitaxial layer 112 (N−). Device 100 further comprises, at the interface between substrate 110 and epitaxial layer 112, an N-type doped buried layer 114 (N+), having a higher doping level than epitaxial layer 112. In the shown example, buried region 114 extends in an upper portion of substrate 110 as well as in a lower portion of epitaxial layer 112. The junction between substrate 110 and buried region 114 forms the P-N junction of diode 103. Device 100 further comprises, in an upper portion of epitaxial layer 112 overhanging buried layer 114 and separated from region 114 by a thickness of epitaxial layer 112, a P-type doped region 116 (P+), for example, having a doping level equal to that of substrate 110 or of the same order as that of substrate 110. The junction between region 116 and epitaxial layer 112 forms the P-N junction of diode 101.

Device 100 further comprises, in an upper portion of epitaxial layer 112 which does not overhang buried layer 114, a P-type doped region 118 (P+), for example, having a doping level equal to that of substrate 110 or of the same order as that of substrate 110. The junction between region 118 and epitaxial layer 112 forms the P-N junction of diode 105. The portion of the junction between substrate 110 and epitaxial layer 112, located substantially under region 118 in vertical projection, forms the P-N junction of diode 107.

In the shown example, the first bidirectional protection structure, formed by diodes 101 and 103, and the second bidirectional protection structure, formed by diodes 105 and 107, are insulated from each other and insulated from possible additional components (not shown) of the protection device by insulating regions 120. As an example, insulating regions 120 may be P-type doped walls (PISO) extending approximately vertically from the upper surface to the lower surface of epitaxial layer 112, as illustrated in FIG. 1. As a variation, insulating regions 120 may comprise insulating trenches extending approximately vertically from the upper surface to the lower surface of epitaxial layer 112, and the trenches may possibly extend in an upper portion of substrate 110.

In the example of FIG. 1, the anode of diode 103 and the anode of diode 107 are interconnected via substrate 110, which may be connected to node GND. Further, the cathode of diode 103 and the cathode of diode 101 on the one hand, and the cathode of diode 107 and the cathode of diode 105 on the other hand, are connected via epitaxial layer 112. Further, the anode of diode 101 may be connected to node IO1 via a metallization 122 coating the upper surface of region 116, and the anode of diode 105 may be connected to node IO2 via a metallization 124 coating the upper surface of region 118.

Epitaxial layer 112 is preferably selected to be lightly doped and highly resistive to obtain diodes 101, 105, and 107 having small junction capacitances. The doping level of layer 112 is for example lower than that of substrate 110. In this example, the doping level of epitaxial layer 112 being relatively low, it defines the avalanche voltages of diodes 101, 105, and 107. Further, for a given doping level of substrate 110, the doping level of buried region 114 defines the avalanche voltage of diode 103.

As an example, the doping level of substrate 110 is greater than $10^{18}$ atoms/cm$^3$, for example, in the range from $10^{19}$ to $10^{21}$ atoms/cm$^3$, the doping level of epitaxial layer 112 is lower than $10^{17}$ atoms/cm$^3$, for example, in the range from $10^{13}$ to $10^{16}$ atoms/cm$^3$, and the doping level of buried region 114 is higher than $10^{18}$ atoms/cm$^3$, for example, in the range from $10^{19}$ to $10^{21}$ atoms/cm$^3$. Regions 114, 116, and 118 may typically have thicknesses smaller than 5 μm, for example, in the range from 0.5 to 2.5 μm, and epitaxial layer 112 may have a thickness greater than 5 μm, for example, between 10 and 50 μm.

To form buried region 114 of device 100, a heavily-doped N-type region may be formed in an upper portion of the substrate by diffusion or implantation of N-type dopant elements from the upper surface of the substrate, before the forming of layer 112. This N-type doped region may be delimited by a mask during its forming. The mask may then be removed and layer 112 may be formed by epitaxy over the entire surface of the substrate.

A problem which arises is that, during the various manufacturing steps of device 100 and, in particular, during the step of epitaxial growth of layer 112, dopant elements of buried region 114 are capable of migrating by diffusion outside of region 114. In particular, a phenomenon of lateral migration of dopant elements of region 114 along the interface between substrate 110 and epitaxial layer 112 can be observed. Such a parasitic lateral diffusion causes a degradation of the characteristics of the P-N junction between substrate 110 and epitaxial layer 112 outside of region 114. In the example of FIG. 1, the parasitic lateral diffusion of the dopant elements of region 114 causes a degradation of the characteristics of diode 107. More specifically, at the level of diode 107, a local increase of the N-type doping of layer 112 can be observed, in the vicinity of the junction with substrate 110. Such a local overdoping causes a decrease of the resistivity of layer 112 in the vicinity of the P-N junction of diode 107, and an increase of the junction capacitance of diode 107.

Further, at the scale of a semiconductor wafer having a large number of protection devices of the type shown in FIG. 1 formed thereon, it can be observed that the phenomenon of parasitic diffusion of dopant elements of buried regions 114 is not uniform. This results in significant manufacturing dispersions in terms of performance of the protection devices, and more specifically in terms of junction capacitance of diodes 107 of the protection devices.

Figure 2:
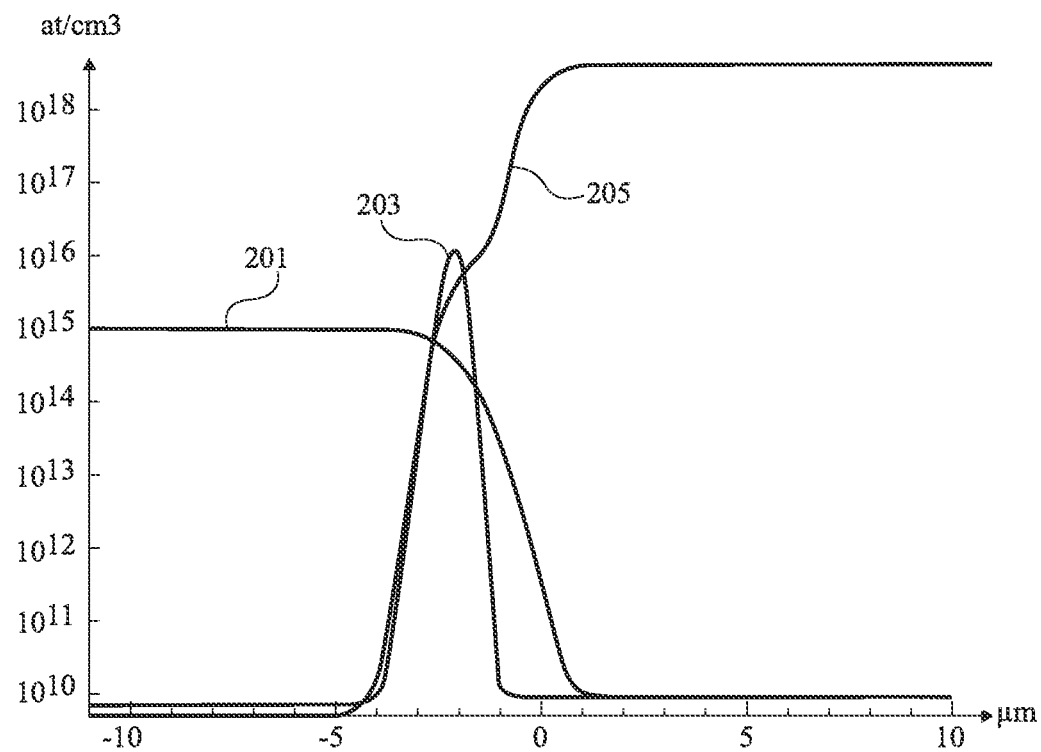
FIG. 2 is a diagram showing an example of a profile of the dopant element concentration in a device of the type described in relation with FIG. 1.

FIG. 2 is a diagram showing an example of a dopant element concentration profile in a device of the type described in relation with FIG. 1. More specifically, FIG. 2 shows a concentration profile along an approximately vertical segment having an approximate 20-μm length, referred to as A-B in FIG. 1, centered on the interface between substrate 110 and layer 112 at the level of diode 107. The axis of ordinates of the diagram of FIG. 2 corresponds to the concentration, in atoms/cm$^3$, and the axis of abscissas, corresponds to the depth in μm from the interface between substrate 110 and layer 112 (value 0 μm corresponds to the interface between substrate 110 and layer 112, and the negative and positive depth values are respectively located in layer 112 and in substrate 110).

In FIG. 2, a curve 201 shows the concentration of N-type dopant elements used for the doping of epitaxial layer 112, for example, phosphorus atoms, a curve 203 shows the concentration of N-type dopant elements used for the doping of buried layer 114, for example, arsenic atoms, and a curve 205 shows the concentration of P-type dopant elements used for the doping of substrate 110, for example, boron atoms. It should be noted that to accurately quantify the phenomenon of diffusion of the dopant elements of buried region 114, N-type dopant elements of different natures have been selected for the doping of region 112 and for the doping of region 114. The described embodiments are however not limited to this specific case.

In the absence of parasitic lateral diffusion of dopant elements of buried region 114, the dopant element concentration of region 114 should be zero or negligible at the level of diode 107. However, as shown by curve 203 of FIG. 2, at the level of diode 107, in layer 112, at a distance of a few micrometers from the interface with substrate 110, a parasitic peak of dopant elements of region 114 can be observed. Such a parasitic concentration peak is non negligible since it has a concentration level (in the order of $10^{16}$ atoms/cm$^3$ in this example) greater than the normal doping level of layer 112 (in the order of $10^{15}$ atoms/cm$^3$ in this example), shown by the plateau of curve 201 in the left-hand portion of the diagram of FIG. 2.

Further, curve 205 of FIG. 2 shows that, during the different manufacturing steps of device 100, P-type dopant elements of substrate 110 diffuse in a lower portion of layer 112, across a thickness of a few micrometers.

It can be observed in FIG. 2 that the crossing point of curves 201 and 205, which would correspond to the point of inversion of the majority carrier type in diode 107 in the absence of a parasitic concentration peak of dopant elements of buried region 114, is located in layer 112, approximately 2.5 μm away from the interface with substrate 110. Due to the presence of the parasitic concentration peak of dopant elements of region 114, the point of inversion of the type of majority carriers in diode 107 is located in layer 112 approximately 1.5 μm away from the interface with substrate 110 (corresponding to the first crossing point between curve 205 and curve 203, starting from the interface with the substrate, that is, the 0-μm abscissa).

More generally, the diagram of FIG. 2 shows that the parasitic diffusion of the dopant elements of buried region 114 has a significant impact on the performance of diode 107, particularly in terms of stray capacitance increase, since it results in non-negligibly modifying the N-type doping level at the level of the P-N junction of diode 107. Further, the phenomenon of parasitic diffusion of the dopant elements of region 114 being relatively fluctuating at the scale of a wafer, the position and the dimensions of the parasitic concentration peak in the adjacent diodes, illustrated by curve 203 of FIG. 2, may vary from one protection device to another, thus resulting in a relatively significant variability of characteristics.

Figure 3:
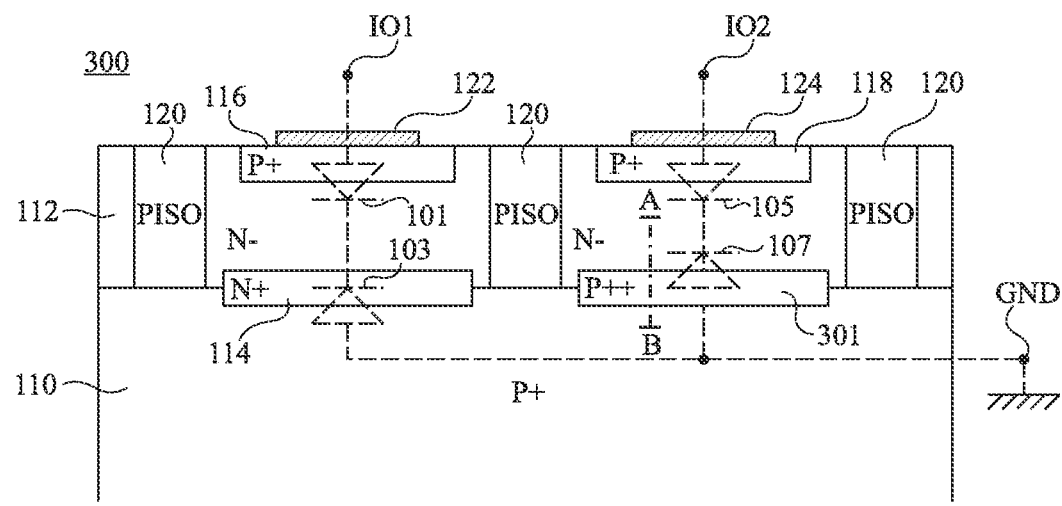
FIG. 3 is a cross-section view schematically showing an embodiment of an overvoltage protection device.

FIG. 3 is a cross-section view schematically showing an embodiment of an overvoltage protection device 300. Device 300 of FIG. 3 comprises many elements common with device 100 of FIG. 1 and will thus not be described again in detail hereafter. Only the differences between device 100 of FIG. 1 and device 300 of FIG. 3 will be detailed hereafter.

The main difference between device 300 of FIG. 3 and device 100 of FIG. 1 is that device 300 comprises, at the interface between substrate 110 and epitaxial layer 112, at the level of diode 107, substantially under region 118 and separated from region 118 by a thickness of epitaxial layer 112, a P-type doped buried region 301 (P++), having a higher doping level than substrate 110. Buried region 301 may for example extend in an upper portion of substrate 110 as well as in a lower portion of epitaxial layer 112. In device 300, the P-N junction of diode 107 is formed by the junction between buried region 301 and epitaxial layer 112. As in the example of FIG. 1, the anode of diode 107 is connected to the anode of diode 103 via substrate 110, which may be connected to node GND, and the cathode of diode 107 is connected to the cathode of diode 105 via epitaxial layer 112. In device 300, as in the example of FIG. 1, the doping level of epitaxial layer 112 sets the avalanche voltage of diodes 101, 105, and 107. As a non-limiting example, the doping level of buried region 301 is approximately from 2 to 10 times higher than the doping level of substrate 110. Buried region 301 for example has a thickness smaller than 5 μm, for example, in the range from 0.5 to 2.5 μm. As an example, the thickness of P-type buried region 301 may be approximately equal to the thickness of N-type buried region 114.

Buried region 301 of device 300 may be formed similarly to buried region 114. As an example, to form region 301, a heavily-doped P-type region may be formed in an upper portion of the substrate by diffusion or implantation of P-type dopant elements from the upper surface of the substrate, before forming layer 112. Such a P-type doped region may be delimited by a mask different from the mask used to form buried region 114. The mask can then be removed and layer 112 may be formed by epitaxy on the entire surface of the substrate.

An advantage of device 300 of FIG. 3 over device 100 of FIG. 1 is that buried region 301 forms a counter-doping which locally neutralizes, at the level of diode 107, the unwanted effects due to the parasitic migration of the dopant elements of buried region 114. Buried region 301 particularly enables to avoid for the migration of the dopant elements of region 114 along the interface between substrate 110 and epitaxial layer 112 to cause an increase of the capacitance of diode 107. Further, buried region 301 enables to strongly decrease manufacturing dispersions, particularly in terms of capacitance of diode 107, as compared with protection devices of the type described in relation with FIG. 1.

Figure 4:
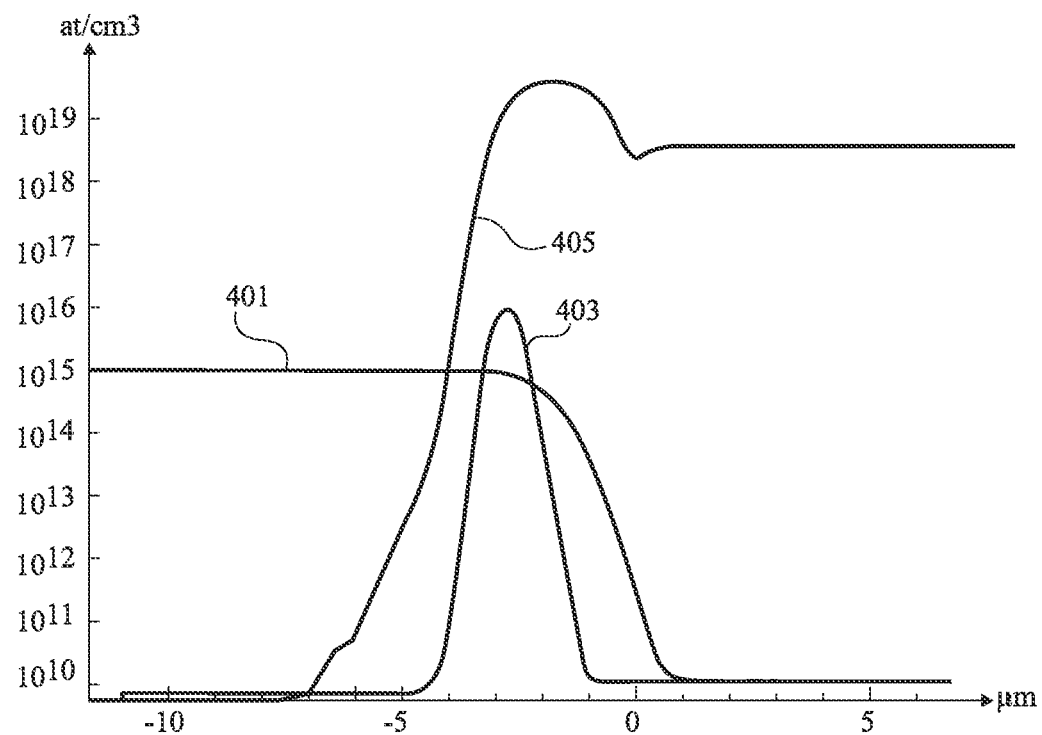
FIG. 4 is a diagram showing an example of a dopant element concentration profile in a device of the type described in relation with FIG. 3.

FIG. 4 is a diagram showing an example of a dopant element concentration profile in a device of the type described in relation with FIG. 3. More specifically, FIG. 4 shows a concentration profile along an approximately vertical segment having an approximate 20-μm length, referred to as A-B in FIG. 3, centered on the interface between substrate 110 and layer 112 at the level of diode 107, and passing through buried region 301. As in the example of FIG. 2, the axis of ordinates of the diagram of FIG. 4 corresponds to the concentration, in atoms/cm$^3$, and the axis of abscissas, corresponds to the depth in μm from the interface between substrate 110 and layer 112.

In FIG. 4, a curve 401 shows the concentration of N-type dopant elements used for the doping of epitaxial layer 112, for example, phosphorus atoms, a curve 403 shows the concentration of N-type dopant elements used for the doping of buried layer 114, for example, arsenic atoms, and a curve 405 shows the concentration of P-type dopant elements used for the doping of substrate 110 and of buried region 301, for example, boron atoms.

As shown by curve 405, the P-type dopant element concentration of substrate 110, shown by the plateau of curve 405 in the right-hand portion of the diagram of FIG. 4, is approximately $5*10^{18}$ atoms/cm$^3$. Curve 405 also shows a more heavily doped area, having a doping level approximately in the range from 2 to $3*10^{19}$ atoms/cm$^3$, approximately located at the center of the diagram of FIG. 4, which corresponds to buried region 301. It should be noted that in this example, region 301 is mostly located in the area between 0 and −3 μm, that is, in epitaxial layer 112. This results from the migration of the P-type dopant elements from the substrate and from region 301 towards epitaxial layer 112 during the various manufacturing steps of device 300. In the left-hand portion of the diagram of FIG. 4 (that is, when progressing towards the upper portion of epitaxial layer 112), curve 405 strongly decreases until it reaches a negligible P-type dopant element concentration.

In the diagram of FIG. 4, curve 401 is similar to cure 201 of the diagram of FIG. 2. The plateau of curve 401 in the left-hand portion of the diagram of FIG. 4 corresponds to the doping level of epitaxial layer 112 (approximately $10^{15}$ atoms/cm$^3$ in this example). In the right-hand portion of the diagram, from the vicinity of the interface between epitaxial layer 112 and substrate 110, curve 401 strongly decreases until it reaches a negligible N-type dopant element concentration.

In the same way as in the example of FIGS. 1 and 2, one can observe at the level of diode 107, in layer 112 at a distance of a few micrometers from the interface with substrate 110, a parasitic concentration peak of dopant elements in region 114 (curve 403). In the shown example, the parasitic concentration peak appearing in curve 403 is identical or similar to that shown by curve 203 of FIG. 2. In particular, it has, in the shown example, a concentration level (in the order of $10^{16}$ atoms/cm$^3$ in this example) greater than the normal doping level of layer 112 (in the order of $10^{15}$ atoms/cm$^3$ in this example).

A difference with the example of FIGS. 1 and 2 is that in the examples of FIGS. 3 and 4, due to the presence of buried layer 301, which causes a sort of local P-type overdoping at the level of diode 107, the P-type doping level at the level of diode 107 is always greater than the N-type dopant element concentration used for the doping of buried region 114. It should in particular be noted that in the example of FIGS. 3 and 4, P-type dopant element concentration curve 405 does not cross curve 403 of concentration of the N-type parasitic dopant elements originating from the diffusion of the dopant elements of buried region 114. Thus, in device 300, the characteristics of the P-N junction of diode 107 are defined by the controlled doping levels of P-type buried region 301 on the one hand, and of epitaxial layer 112 on the other hand, and are not or little impacted by the parasitic diffusion of the dopant elements of buried region 114 of the device. The addition of P-type buried region 301 thus enables, in particular, to avoid a capacitance increase of diode 107 due to the parasitic diffusion of the dopant elements of region 114, and further enables to decrease characteristic dispersions, and particularly the capacitance dispersion of diodes 107 at the scale of a wafer.

Specific embodiments have been described. Various alterations, modifications, and improvements will readily occur to those skilled in the art.

In particular, the described embodiments are not limited to the specific examples of protection device described in relation with FIGS. 1 and 3. More generally, in any protection device comprising:

a substrate of a first conductivity type coated with a more lightly-doped epitaxial layer of the second conductivity type;

at least a first buried region of the second conductivity type, located at the interface between the substrate and the epitaxial layer and more heavily doped than the epitaxial layer, such a buried region defining with the substrate a first diode of the protection device; and at least a second diode, for example, adjacent to the first diode, having its region of the first conductivity type connected to the substrate and having its region of the second conductivity type formed by the epitaxial layer, a buried layer of the first conductivity type and having a higher doping level than the substrate may be provided at the interface between the substrate and the epitaxial layer at the level of the second diode, to improve the characteristics of this second diode, particularly in terms of capacitance.

As a non-limiting example, the described embodiments may apply to a protection structure of the type described in relation with FIG. 3, but from which diode 105 would be absent (P-type region 118 would then be replaced with an N-type contacting region having a higher doping level than layer 112) and nodes IO1 and IO2 would be interconnected.

Further, as compared with the examples described in relation with FIGS. 1 to 4, all conductivity types may be inverted.

Further the described embodiments are not limited to the specific examples of numerical values mentioned hereabove, particular the values of doping levels, thicknesses, start voltages, etc.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An overvoltage protection device comprising:
    a doped substrate of a first conductivity type having a first doping level, coated with a doped epitaxial layer of the second conductivity type having a second doping level;
    a first doped buried region of the second conductivity type having a third doping level greater than the second level, located at the interface between the substrate and the epitaxial layer in a first portion of the device, wherein the junction between the substrate and the first buried region forms a first diode having its conduction area of the second conductivity type coupled to a first terminal of the device via the epitaxial layer; and
    a second doped buried region of the first conductivity type having a fourth doping level greater than the first level, located at the interface between the substrate and the epitaxial layer in a second portion of the device, the junction between the second buried region and the epitaxial layer forms a second diode having its conduction area of the second conductivity type coupled to a second terminal of the device via the epitaxial layer.

2. The device of claim 1, wherein the first and second diodes have their conduction areas of the first conductivity type connected via the substrate.

3. The device of claim 1, wherein the first diode is a diode having a controlled avalanche voltage.

4. The device of claim 1, wherein the second diode is a diode having a controlled avalanche voltage.

5. The device of claim 1, wherein the second diode is a standard diode which is not intended to operate in avalanche.

6. The device of claim 1, wherein the first and second diodes have their conduction areas of the second conductivity type separated by a vertical insulating region crossing the epitaxial layer.

7. The device of claim 1, wherein the second doping level is lower than the first doping level.

8. The device of claim 1, wherein the first doping level is greater than $10^{18}$ atoms/cm$^3$, the second doping level is lower than $10^{17}$ atoms/cm$^3$, the third doping level is greater than $10^{18}$ atoms/cm$^3$, and the fourth doping level is from 2 to 10 times the first doping level.

9. The device of claim 1, wherein the first doping level is in the range from $10^{19}$ to $10^{21}$ atoms/cm$^3$, the second doping level is in the range from $10^{13}$ to $10^{16}$ atoms/cm$^3$, the third doping level is in the range from $10^{19}$ to $10^{21}$ atoms/cm$^3$, and the fourth doping level is from 2 to 10 times the first doping level.

10. An overvoltage protection device comprising:
a doped substrate of a first conductivity type having a first doping level, coated with a doped epitaxial layer of the second conductivity type having a second doping level;
a first doped buried region of the second conductivity type having a third doping level greater than the second level, located at the interface between the substrate and the epitaxial layer in a first portion of the device, wherein the junction between the substrate and the first buried region forms a first diode; and
a second doped buried region of the first conductivity type having a fourth doping level greater than the first level, located at the interface between the substrate and the epitaxial layer in a second portion of the device, the junction between the second buried region and the epitaxial layer forms a second diode;
wherein the first diode is a diode having a controlled avalanche voltage.

11. The device of claim 10, wherein the first diode has its conduction area of the second conductivity type coupled to a first terminal of the device via the epitaxial layer, and wherein the second diode has its conduction area of the second conductivity type coupled to a second terminal of the device via the epitaxial layer.

12. The device of claim 10, wherein the second doping level is lower than the first doping level.

13. The device of claim 10, wherein the first doping level is greater than $10^{18}$ atoms/cm$^3$, the second doping level is lower than $10^{17}$ atoms/cm$^3$, the third doping level is greater than $10^{18}$ atoms/cm$^3$, and the fourth doping level is from 2 to 10 times the first doping level.

14. The device of claim 10, wherein the first doping level is in the range from $10^{19}$ to $10^{21}$ atoms/cm$^3$, the second doping level is in the range from $10^{13}$ to $10^{16}$ atoms/cm$^3$, the third doping level is in the range from $10^{19}$ to $10^{21}$ atoms/cm$^3$, and the fourth doping level is from 2 to 10 times the first doping level.

15. An overvoltage protection device comprising:
a doped substrate of a first conductivity type having a first doping level, coated with a doped epitaxial layer of the second conductivity type having a second doping level;
a first doped buried region of the second conductivity type having a third doping level greater than the second level, located at the interface between the substrate and the epitaxial layer in a first portion of the device, wherein the junction between the substrate and the first buried region forms a first diode; and
a second doped buried region of the first conductivity type having a fourth doping level greater than the first level, located at the interface between the substrate and the epitaxial layer in a second portion of the device, the junction between the second buried region and the epitaxial layer forms a second diode;
wherein the second diode is a diode having a controlled avalanche voltage.

16. The device of claim 15, wherein the first diode has its conduction area of the second conductivity type coupled to a first terminal of the device via the epitaxial layer, and wherein the second diode has its conduction area of the second conductivity type coupled to a second terminal of the device via the epitaxial layer.

17. The device of claim 15, wherein the second doping level is lower than the first doping level.

18. The device of claim 15, wherein the first doping level is greater than $10^{18}$ atoms/cm$^3$, the second doping level is lower than $10^{17}$ atoms/cm$^3$, the third doping level is greater than $10^{18}$ atoms/cm$^3$, and the fourth doping level is from 2 to 10 times the first doping level.

19. The device of claim 15, wherein the first doping level is in the range from $10^{19}$ to $10^{21}$ atoms/cm$^3$, the second doping level is in the range from $10^{13}$ to $10^{16}$ atoms/cm$^3$, the third doping level is in the range from $10^{19}$ to $10^{21}$ atoms/cm$^3$, and the fourth doping level is from 2 to 10 times the first doping level.

20. An overvoltage protection device comprising:
a doped substrate of a first conductivity type having a first doping level, coated with a doped epitaxial layer of the second conductivity type having a second doping level;
a first doped buried region of the second conductivity type having a third doping level greater than the second level, located at the interface between the substrate and the epitaxial layer in a first portion of the device, wherein the junction between the substrate and the first buried region forms a first diode; and
a second doped buried region of the first conductivity type having a fourth doping level greater than the first level, located at the interface between the substrate and the epitaxial layer in a second portion of the device, the junction between the second buried region and the epitaxial layer forms a second diode;
wherein the first and second diodes have their conduction areas of the second conductivity type separated by a vertical insulating region crossing the epitaxial layer.

21. The device of claim 20, wherein the first diode has its conduction area of the second conductivity type coupled to a first terminal of the device via the epitaxial layer, and wherein the second diode has its conduction area of the second conductivity type coupled to a second terminal of the device via the epitaxial layer.

22. The device of claim 20, wherein the second doping level is lower than the first doping level.

23. The device of claim 20, wherein the first doping level is greater than $10^{18}$ atoms/cm$^3$, the second doping level is lower than $10^{17}$ atoms/cm$^3$, the third doping level is greater than $10^{18}$ atoms/cm$^3$, and the fourth doping level is from 2 to 10 times the first doping level.

24. The device of claim 20, wherein the first doping level is in the range from $10^{19}$ to $10^{21}$ atoms/cm$^3$, the second doping level is in the range from $10^{13}$ to $10^{16}$ atoms/cm$^3$, the third doping level is in the range from $10^{19}$ to $10^{21}$ atoms/cm$^3$, and the fourth doping level is from 2 to 10 times the first doping level.

* * * * *